(12) United States Patent
Kim et al.

(10) Patent No.: US 9,425,422 B2
(45) Date of Patent: Aug. 23, 2016

(54) ORGANIC LIGHT EMITTING DISPLAY DEVICE

(71) Applicant: LG Display Co., Ltd., Seoul (KR)

(72) Inventors: Shin-Han Kim, Gyeonggi-do (KR); Hwa-Kyung Kim, Seoul (KR); Hong-Seok Choi, Seoul (KR); Gwi-Jeong Cho, Daegu (KR); Youn-Seok Kam, Seoul (KR); Mi-Young Han, Gyeonggi-do (KR); Hye-Min Oh, Seoul (KR); Tae-Shick Kim, Gyeonggi-do (KR); Seong-Su Jeon, Gyeonggi-do (KR); Chi-Yul Song, Incheon (KR)

(73) Assignee: LG Display Co., Ltd., Seoul (KR)

( * ) Notice: Subject to any disclaimer, the term of this patent is extended or adjusted under 35 U.S.C. 154(b) by 73 days.

(21) Appl. No.: 14/023,670

(22) Filed: Sep. 11, 2013

(65) Prior Publication Data

US 2014/0070196 A1 Mar. 13, 2014

(30) Foreign Application Priority Data

Sep. 12, 2012 (KR) .......................... 10-2012-0100935
Aug. 13, 2013 (KR) .......................... 10-2013-0095778

(51) Int. Cl.
*H01L 29/08* (2006.01)
*H01L 51/50* (2006.01)

(52) U.S. Cl.
CPC .......... *H01L 51/5024* (2013.01); *H01L 51/504* (2013.01); *H01L 2251/5384* (2013.01)

(58) Field of Classification Search
CPC .......................... H01L 27/3209; H01L 51/5016
USPC .......................................................... 257/40
See application file for complete search history.

(56) References Cited

U.S. PATENT DOCUMENTS

| 6,967,062 | B2 * | 11/2005 | Hatwar | ............... | H01L 51/5064 257/88 |
| 2002/0025419 | A1 * | 2/2002 | Lee | ..................... | H01L 51/504 428/212 |
| 2003/0038287 | A1 * | 2/2003 | Suzuki | ................ | H01L 51/0011 257/40 |

(Continued)

OTHER PUBLICATIONS

Ng and Sze, "Physics of Semiconductor Devices", John Wiley & Sons Publication, Third Edition, ch12, Figure 1.*

(Continued)

*Primary Examiner* — Trung Q Dang
*Assistant Examiner* — Patricia Reddington
(74) *Attorney, Agent, or Firm* — Morgan, Lewis & Bockius LLP

(57) ABSTRACT

Disclosed is an organic light emitting display device with an enhanced light emission efficiency at high current and an enhancement in panel efficiency through prevention of a roll-off phenomenon. The organic light emitting display device includes first and second electrodes formed on a substrate facing each other. A hole injection layer, a hole transport layer, at least first and second light emitting layers, and an electron transport layer are sequentially stacked between the first and second electrodes. The first light emitting layer includes different hosts while being doped with the same dopant in different dosages. The first light emitting layer includes a first host and a second host, and the second light emitting layer includes the first host and a third host different from the second host. The first and second light emitting layers are doped with the same phosphorescent yellow-phosphorescent green dopant in the same dosage.

20 Claims, 14 Drawing Sheets

(56) References Cited

U.S. PATENT DOCUMENTS

| | | | |
|---|---|---|---|
| 2005/0248267 A1* | 11/2005 | Gyoutoku | H01L 51/5278 313/506 |
| 2006/0257684 A1* | 11/2006 | Arakane | C09K 11/06 428/690 |
| 2007/0252516 A1* | 11/2007 | Kondakova | H01L 51/5016 313/504 |
| 2009/0179196 A1* | 7/2009 | Adachi | C07C 15/38 257/40 |
| 2010/0133522 A1* | 6/2010 | Pieh | H01L 27/3209 257/40 |
| 2011/0057195 A1 | 3/2011 | Yin et al. | |
| 2011/0073844 A1* | 3/2011 | Pieh | H01L 51/5036 257/40 |
| 2011/0215309 A1* | 9/2011 | D'Andrade | H01L 51/5016 257/40 |
| 2013/0105767 A1* | 5/2013 | Lin et al. | 257/40 |

OTHER PUBLICATIONS

Chinese Office Action dated Sep. 6, 2015, in Chinese Patent Application No. 201310412355.7.

* cited by examiner

Case A (28)

Case B (20)

Case C (22)

ate the intensity of light is reduced. Since the FWHM area according to the conventional white OLED is small, the intensity of light according to a green wavelength and the intensity of light according to red wavelength are reduced, thereby causing a reduction in color reproduction range. As a result, a reduction in panel efficiency occurs.

ORGANIC LIGHT EMITTING DISPLAY DEVICE

This application claims the benefits of the Korean Patent Application No. 10-2012-0100935, filed on Sep. 12, 2012, and of the Korean Patent Application No. 10-2013-0095778, filed on Aug. 13, 2013 which are hereby incorporated by reference as if fully set forth herein.

BACKGROUND OF THE INVENTION

1. Field of the Invention

The present invention relates to an organic light emitting display device, and, more particularly, to an organic light emitting display device capable of achieving an enhancement in light emission efficiency at high current and an enhancement in panel efficiency through prevention of a roll-off phenomenon.

2. Discussion of the Related Art

An image display device, which renders a variety of information on a screen, is a core technology of the information age. Such an image display device is developing toward enhanced thinness, enhanced lightness, and enhanced portability as well as enhanced performance. Currently, an organic light emitting device capable of displaying an image through control of light emission of an organic light emitting layer is highlighted as a flat display device capable of eliminating disadvantages of heavy and bulky structures of cathode ray tubes (CRTs).

Such an organic light emitting device (OLED), which is a self-luminous device employing a thin light emitting layer arranged between electrodes, is advantageous in that it may have a thin film structure such as a paper sheet. In detail, the OLED includes an anode, a hole injection layer (HIL), a hole transport layer (HTL), a light emitting layer, an electron injection layer (EIL), an electron transport layer (ETL), and a cathode.

In particular, an organic light emitting display device is considered an application having competitiveness in that it does not require a separate light source while achieving compactness and distinct color display.

Recently, such an organic light emitting display device employs a white OLED with a stack structure including a first stack structure having a fluorescent blue light emitting layer, and a second stack structure having a phosphorescent yellow-phosphorescent green light emitting layer. In such a white OLED, blue light emitted from the fluorescent blue light emitting layer and yellow light emitted from the phosphorescent yellow-phosphorescent green light emitting layer are mixed, thereby rendering white light.

In this case, the phosphorescent yellow-phosphorescent green light emitting layer may exhibit a roll-off phenomenon in which a reduction in light emission efficiency occurs due to an increase in triplet-triplet annihilation (TTA) exhibited at higher current. As a result, light emission efficiency at high current may be degraded.

A phosphorescent yellow-phosphorescent green wavelength range according to the conventional white OLED includes a green wavelength and a red wavelength. The full width at half maximum (FWHM) according to the conventional phosphorescent yellow-phosphorescent green wavelength range is small, as illustrated in FIG. 1. FWHM means a width at a half maximum height. When the FWHM area is small, the intensity of light according to a green wavelength and the intensity of light according to a red wavelength are reduced. That is, the intensity of light is proportional to the FWHM area. For example, when the FWHM area is small, the

SUMMARY OF THE INVENTION

Accordingly, the present invention is directed to an organic light emitting display device that substantially obviates one or more problems due to limitations and disadvantages of the related art.

An object of the present invention is to provide an organic light emitting display device capable of achieving an enhancement in light emission efficiency at high current and an enhancement in panel efficiency through prevention of a roll-off phenomenon.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes first and second electrodes formed on a substrate while facing each other, and a hole injection layer, a hole transport layer, at least two light emitting layers, and an electron transport layer sequentially stacked between the first and second electrodes, wherein the at least two light emitting layers comprise different hosts, respectively, while being doped with the same dopant in different dosages, respectively.

The at least two light emitting layers may include a first light emitting layer including a first host while being doped with a phosphorescent yellow-phosphorescent green dopant, and a second light emitting layer including a second host different from the first host while being doped with the same phosphorescent yellow-phosphorescent green dopant as the first light emitting layer in a different dosage than the first light emitting layer.

The first host may have a first highest occupied molecular orbital (HOMO) level lower than or equal to a HOMO level of the hole transport layer. The first HOMO level may have a difference of −0.05 to −0.5 eV from the HOMO level of the hole transport layer.

The first HOMO level may be −6.0 to −5.0 eV, and the first host may have a first lowest unoccupied molecular orbital (LUMO) level of −2.5 to −2.3 eV while having a hole mobility of $5.0 \times 10^{-5}$ to $1.0 \times 10^{-5}$ cm$^2$/Vs.

The phosphorescent yellow-phosphorescent green dopant of the first light emitting layer may be doped in the first light emitting layer in a dosage of 1 to 10% on the basis of a volume of the first light emitting layer.

The second light emitting layer may have a second LUMO level greater than or equal to a LUMO level of the electron transport layer. The second LUMO level may have a difference of −0.05 to −0.5 eV from the LUMO level of the electron transport layer.

The second light emitting layer may have a second HOMO level of −6.5 to −5.0 eV, and a second LUMO level of −3.0 to −2.0 eV. The second host My have an electron mobility of $9.0\times10^{-5}$ to $1.0\times10^{-3}$ cm$^2$/Vs.

The phosphorescent yellow-phosphorescent green dopant of the second light emitting layer may be doped in the second light emitting layer in a dosage of 10 to 20% on the basis of a volume of the second light emitting layer.

Each of the first and second hosts may have a triplet level of 2.0 to 3.0 eV.

A thickness from the first light emitting layer to a position reaching the second electrode is expressed by the following Expression 1:

$$H'=\lambda/4n+200 \text{ Å} \sim \lambda/4n-100 \text{ Å} \qquad \text{[Expression 1]}$$

where, "H'" represents a thickness from the first light emitting layer to the position reaching the second electrode, "n" represents a refractive index, and "λ" represents a photoluminescence peak wavelength of the dopant.

A thickness from the second light emitting layer to a position reaching the second electrode may be expressed by the following Expression 2:

$$H=\lambda/4n+50 \text{ Å} \sim \lambda/4n-200 \text{ Å} \qquad \text{[Expression 2]}$$

where, "H" represents a thickness from the second light emitting layer to the position reaching the second electrode, "n" represents a refractive index, and "λ" represents a photoluminescence peak wavelength of the dopant.

In another aspect of the present invention, an organic light emitting display device includes first and second electrodes formed on a substrate while facing each other, a first stack including a hole injection layer, a third hole transport layer, a fourth hole transport layer, a third light emitting layer, and a second electron transport layer sequentially stacked on the first electrode, a second stack including a first hole transport layer, a second hole transport layer, at least two light emitting layers, and a first electron transport layer sequentially stacked between the first stack and the second electrode, and a charge generation layer formed between the first stack and the second stack, to adjust change balance between the first stack and the second stack, wherein the at least two light emitting layers include different hosts, respectively, while being doped with the same yellow-green dopant in different dosages, respectively.

In another aspect of the present invention, an organic light emitting display device includes first and second electrodes formed on a substrate while facing each other, and a hole injection layer, a hole transport layer, at least first and second light emitting layers, and an electron transport layer sequentially stacked between the first and second electrodes, wherein the first light emitting layer includes a first host and a second host, the second light emitting layer includes the first host and a third host, and the first and second light emitting layers are doped with the same phosphorescent yellow-phosphorescent green dopant in the same dosage.

The first host may have a first LUMO level greater than or equal to a LUMO level of the electron transport layer. The first LUMO level may have a difference of +0.05 to +0.2 eV from the LUMO level of the electron transport layer.

The first host may have a first HOMO level of −6.0 to −5.0 eV while having a hole mobility of $5.0\times10^{-5}$ to $1.0\times10^{-5}$ cm$^2$/Vs.

The second host may have a second HOMO level lower than or equal to a HOMO level of the hole transport layer. The second HOMO level may have a difference of −0.05 to −0.5 eV from the HOMO level of the hole transport layer.

The second host may have a second lowest unoccupied molecular orbital (LUMO) level of −2.5 to −2.3 eV while having a hole mobility of $9.0\times10^{-4}$ to $1.0\times10^{-3}$ cm$^2$/Vs.

The third host has a third HOMO level lower than or equal to a HOMO level of the hole transport layer. The third HOMO level may have a difference of −0.05 to −0.5 eV from the HOMO level of the hole transport layer.

The third host may have a third lowest unoccupied molecular orbital (LUMO) level of −2.5 to −2.3 eV while having a hole mobility of $9.0\times10^{-4}$ to $1.0\times10^{-3}$ cm$^2$/Vs.

The third host may have a higher hole mobility than the second host. Each of the first, second, and third second hosts may have a triplet level of 2.0 to 3.0 eV.

The phosphorescent yellow-phosphorescent green dopant of each of the first and second light emitting layers may be doped in the corresponding first or second light emitting layer in a dosage of 8 to 25% on the basis of a volume of the corresponding first or second light emitting layer.

In another aspect of the present invention, an organic light emitting display device includes first and second electrodes formed on a substrate while facing each other, a first stack including a hole injection layer, a third hole transport layer, a fourth hole transport layer, a third light emitting layer, and a second electron transport layer sequentially stacked on the first electrode, a second stack including a first hole transport layer, a second hole transport layer, at least two first and second light emitting layers, and a first electron transport layer sequentially stacked between the first stack and the second electrode, a first charge generation layer formed between the first stack and the second stack, to adjust change balance between the first stack and the second stack, a third stack including a fifth hole transport layer, a fourth light emitting layer, and a third electron transport layer stacked between the second stack and the second electrode, and a second charge generation layer formed between the second stack and the third stack, to adjust change balance between the second stack and the third stack, wherein the first light emitting layer include a first host and a second host, the second light emitting layer include the first host and a third host different from the second host, and the first and second light emitting layers are doped with the same phosphorescent yellow-phosphorescent green dopant in the same dosage.

Each of the third and fourth light emitting layers may include a host and a blue fluorescent material as a dopant, to emit blue light.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In the following description of the present invention, a detailed description of known functions and configurations incorporated herein will be omitted when it may obscure the subject matter of the present invention.

Hereinafter, the preferred embodiments of the present invention will be described with reference to FIGS. 2A to 8.

Figure 1:
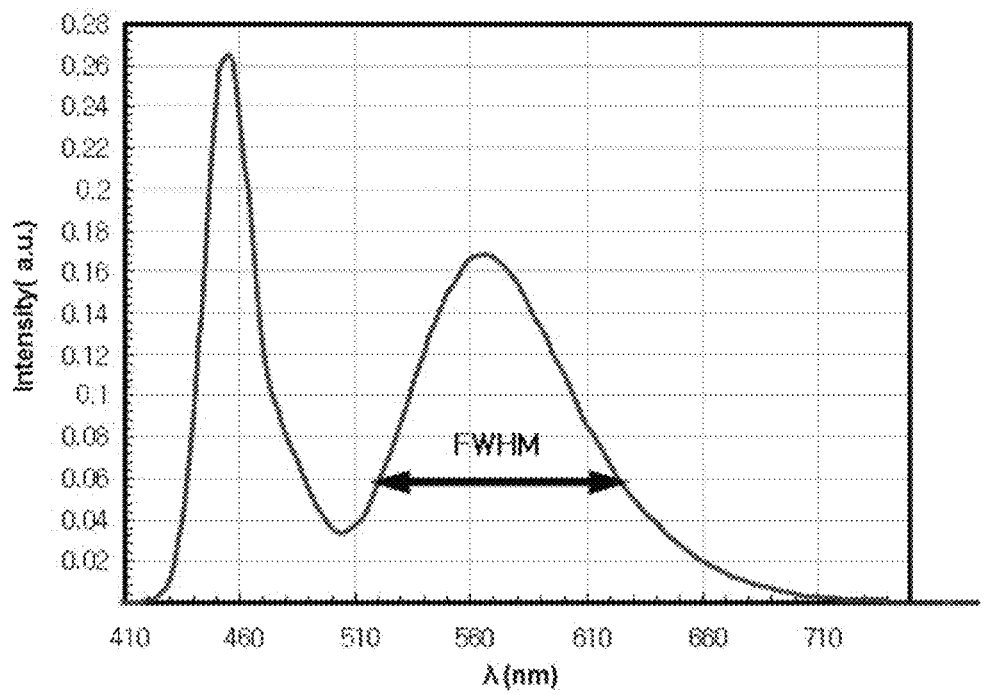
FIG. 1 is a graph depicting a electroluminescence peak wavelength according to a conventional white organic light emitting device (OLED)
Figure 2A:
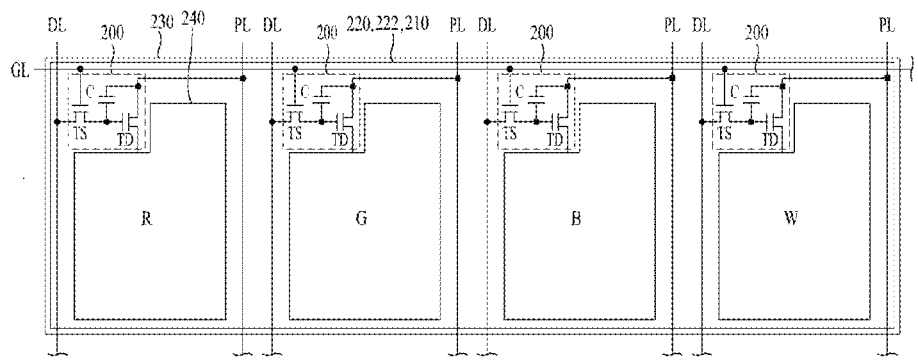
FIGS. 2A to 2D are equivalent circuit diagrams of R, G, B, and W pixels in an organic light emitting display device according to an embodiment of the present invention.
Figure 3:
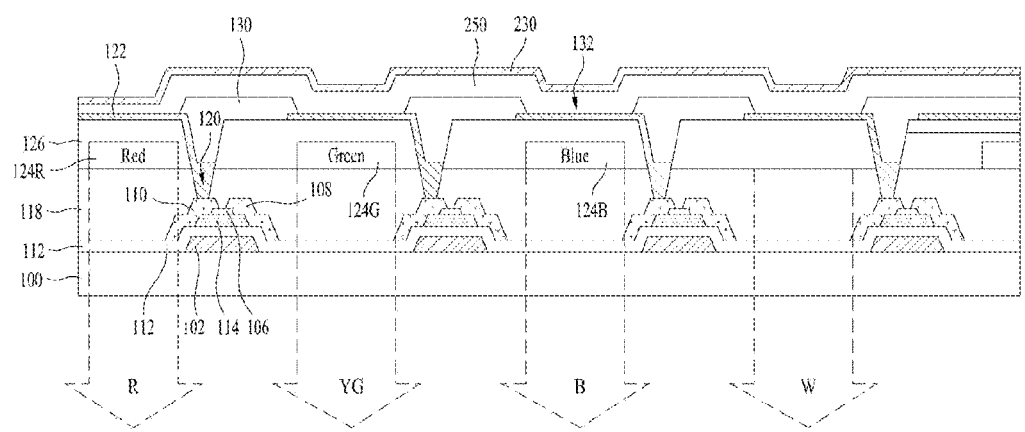
FIG. 3 is a sectional view of the organic light emitting display device illustrating R, G, B, W sub-pixel regions of FIGS. 2A to 2D.
Figure 4:
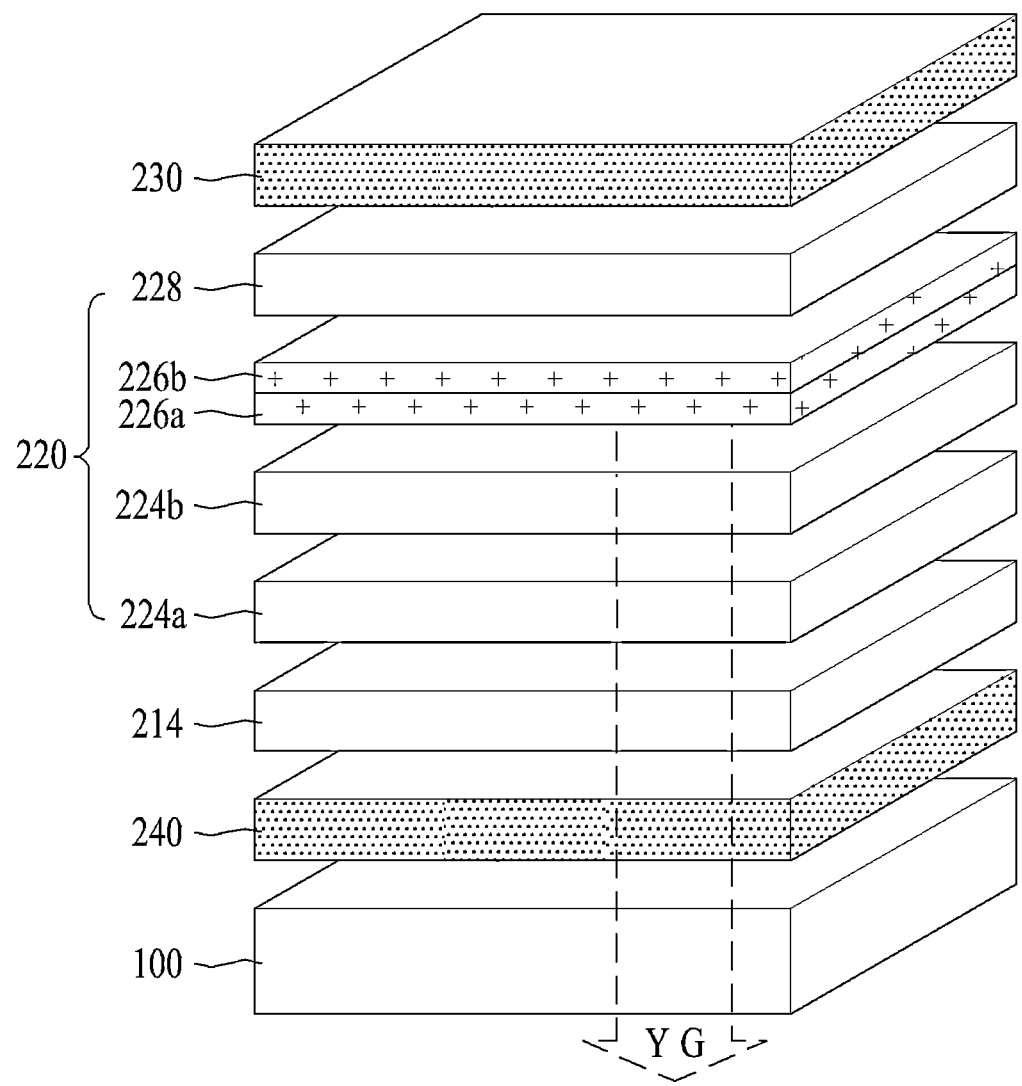
FIG. 4 is a perspective view illustrating a white OLED according to a first embodiment of the present invention.
Figure 5:
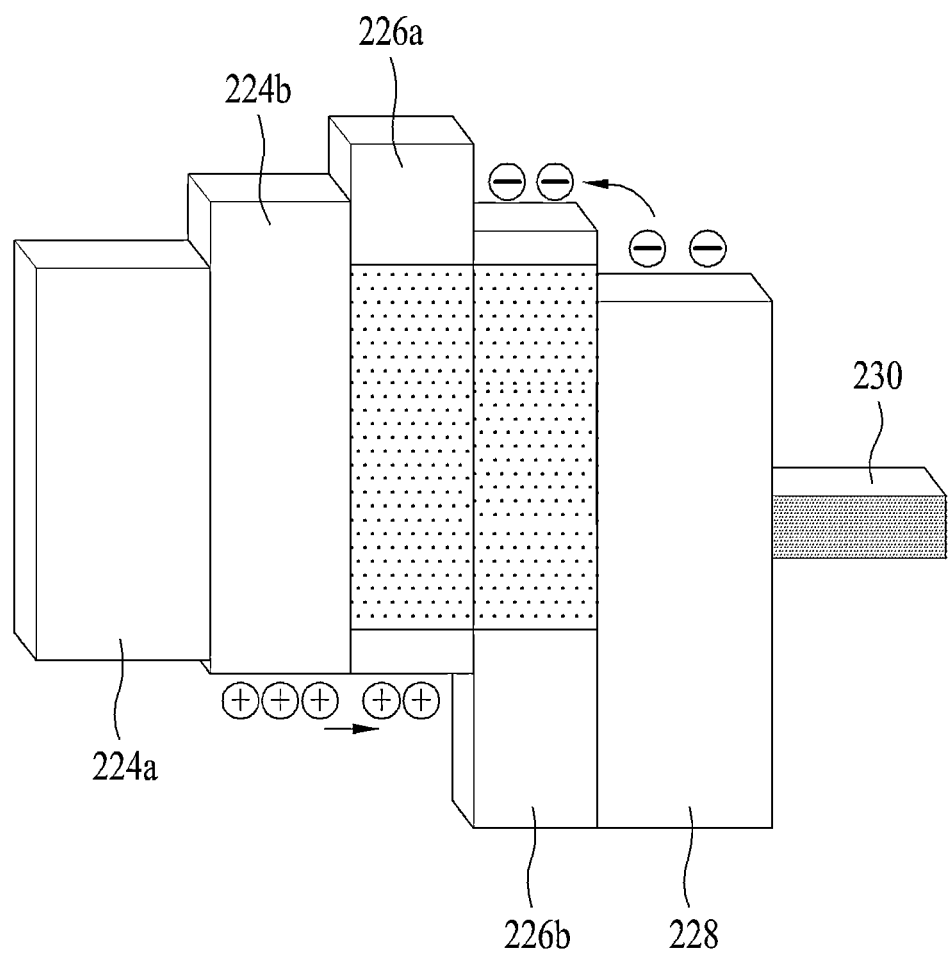
FIG. 5 is a band diagram of the white OLED according to the first embodiment of the present invention.

FIGS. 2A to 2D are equivalent circuit diagrams of R, G, B, and W pixels in an organic light emitting display device according to an embodiment of the present invention. FIG. 3 is a sectional view of the organic light emitting display device illustrating R, G, B, W sub-pixel regions of FIGS. 2A to 2D. FIG. 4 is a perspective view illustrating a white organic light emitting device (OLED) according to an embodiment of the present invention. FIG. 5 is a band diagram of the white OLED illustrated in FIG. 4.

The organic light emitting display device according to the illustrated embodiment of the present invention includes a substrate with a display area defined by a plurality of sub-pixel regions formed in the form of a matrix, and a sealing substrate for protecting sub-pixels formed on the substrate from moisture or oxygen.

The plural sub-pixel regions are divided into R sub-pixel regions, G sub-pixel regions, B sub-pixel regions, and W sub-pixel regions. As illustrated in FIG. 2A, such plural sub-pixel regions may be arranged such that R, G, B, and W sub-pixel regions are aligned to have an arrangement of 1 row×4 columns while being parallel to gate lines, as illustrated in FIG. 2A. Although the plural sub-pixel regions are arranged in an order of R, G, B, and W sub-pixel regions in the case of FIG. 2A, they may be arranged in an order of R, B, G, and W sub-pixel regions or in an order of W, R, G, and B sub-pixel regions. That is, the arrangement order of the sub-pixel regions may be varied in accordance with user's desire without being limited to a particular order.

Figure 2B:
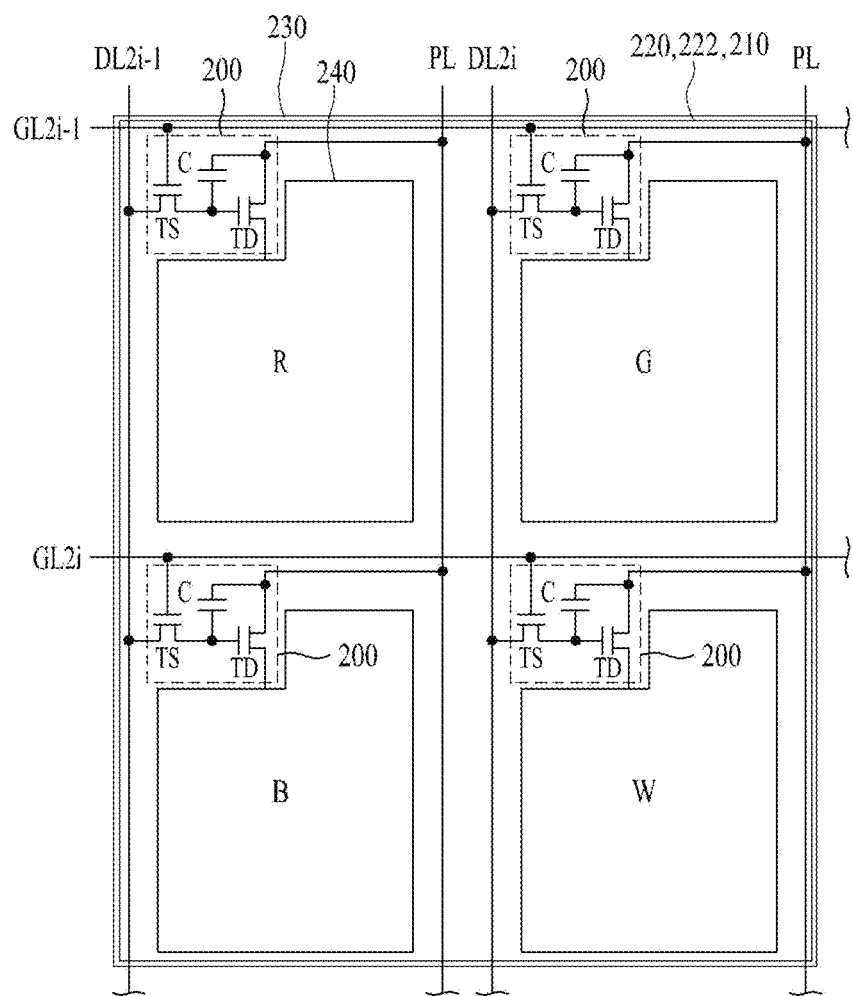
Figure 2C:
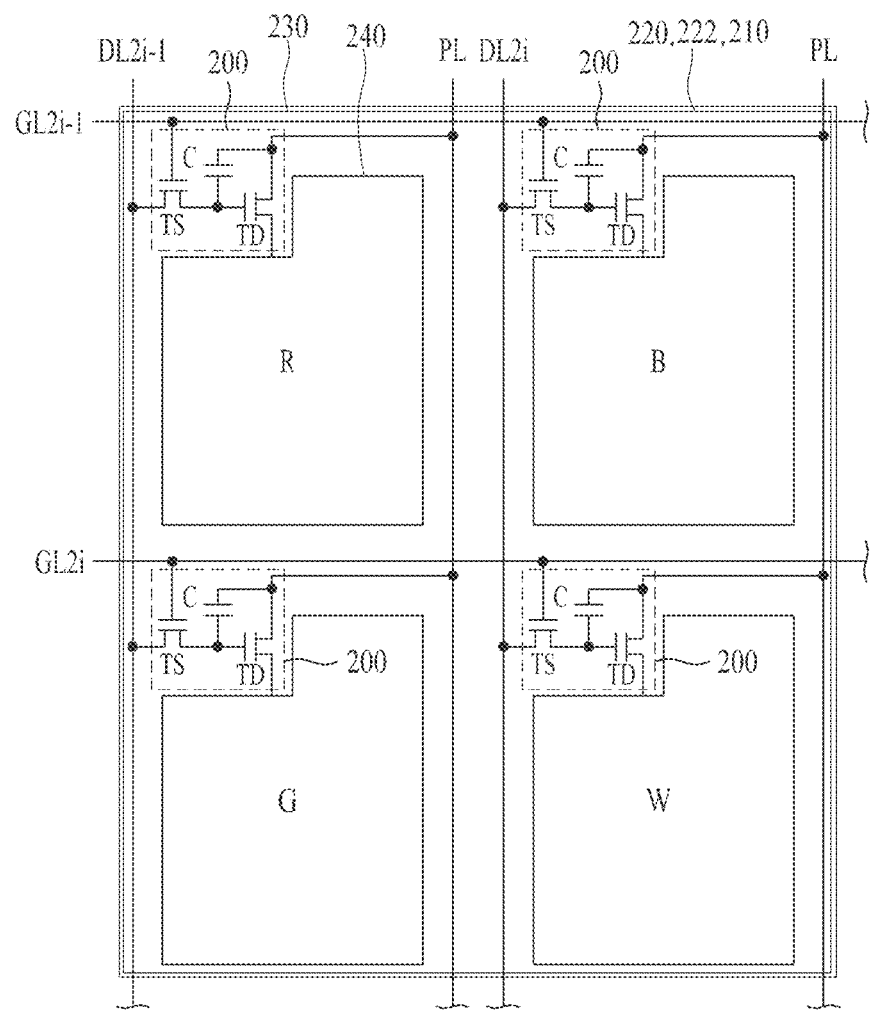

The R, B, G, and W sub-pixel regions may also be arranged to have an arrangement of 2 rows×2 columns, as illustrated in FIGS. 2B and 2C. For example, as illustrated in FIG. 2B, an R sub-pixel region may be formed in a region where a "2i−1"-th data line DL2i−1 ("i" is a natural number equal to or greater than 1) and a "2i−1"-th gate line GL2i−1 intersect, a G sub-pixel region may be formed in a region where a 2i-th data line DL2i and the "2i−1"-th gate line GL2i−1 intersect, a B sub-pixel region may be formed in a region where the "2i−1"-th data line DL2i−1 and a "2i"-th gate line GL2i intersect, and a W sub-pixel region may be formed in a region where the 2i-th data line DL2i and the 2i-th gate line GL2i intersect.

Alternatively, as illustrated in FIG. 2C, an R sub-pixel region may be formed in the region where the "2i−1"-th data line DL2i−1 and the "2i−1"-th gate line GL2i−1 intersect, a B sub-pixel region may be formed in the region where the 2i-th data line DL2i and the "2i−1"-th gate line GL2i−1 intersect, a G sub-pixel region may be formed in the region where the "2i−1"-th data line DL2i−1 and the "2i"-th gate line GL2i intersect, and a W sub-pixel region may be formed in the region where the 2i-th data line DL2i and the 2i-th gate line GL2i intersect.

Figure 2D:
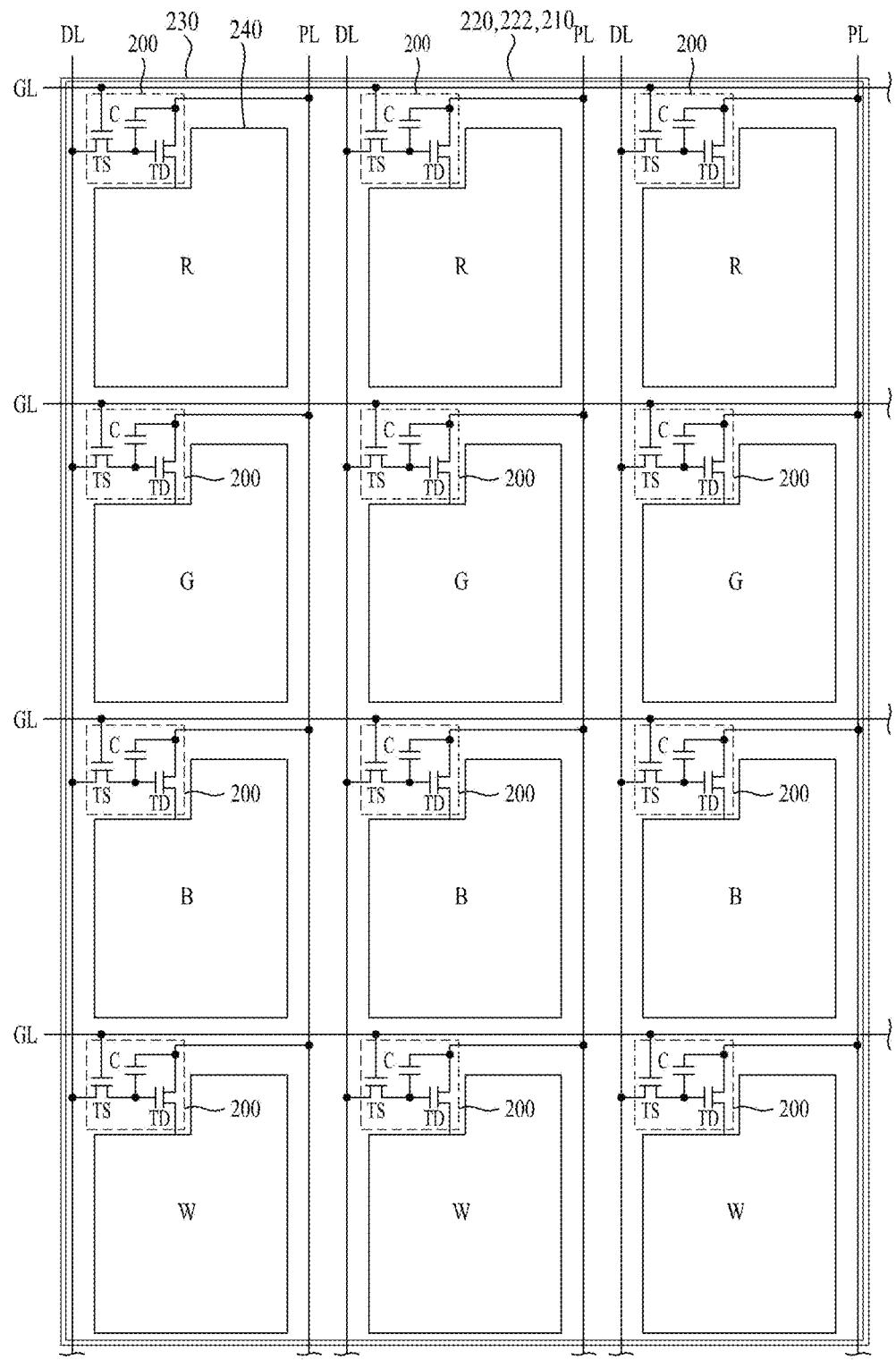

On the other hand, as shown in FIG. 2D, R, B, G, and W sub-pixel regions may be arranged such that the same sub-pixel regions are aligned in a direction of gate lines. For example, R sub-pixel regions may be arranged on a first one of the gate lines, G sub-pixel regions may be arranged on a second one of the gate lines, B sub-pixel regions may be arranged on a third one of the gate lines, and W sub-pixel regions may be arranged on a fourth one of the gate lines.

As illustrated in FIGS. 2A to 2D, each of the R, G, B, and W sub-pixel regions includes a cell driver 200, and a white organic light emitting device (OLED) connected to the cell driver 200.

The cell driver 200 includes a switch thin film transistor TS connected to one gate line GL and one data line DL, a drive thin film transistor TD connected among the switch thin film transistor TS, a power line PL, and a first electrode of the white OLED, and a storage capacitor C connected between the power line PL and a drain electrode of the switch thin film transistor TS. Each sub-pixel region may have a structure including a switch transistor, a drive transistor, a capacitor, and an OLED, or a structure including an additional transistor and an additional capacitor in addition to the above-described elements. Although the drive thin film transistor is directly connected to the first electrode of the white OLED in the above-described case, another thin film transistor may be formed between the drive thin film transistor and the white OLED.

The gate electrode of the switch thin film transistor TS is connected to the gate line GL. The source electrode of the switch thin film transistor TS is connected to the data line DL. The drain electrode of the switch thin film transistor TS is connected to the gate electrode of the drive thin film transistor TD and storage capacitor C. The source electrode of the drive thin film transistor TD is connected to the power line PL. The drain electrode of the drive thin film transistor TD is connected to the first electrode. The storage capacitor C is connected between the power line PL and the drive thin film transistor TD.

When a scan pulse is supplied to the gate line GL, the switch thin film transistor TS is turned on, to supply a data signal supplied to the data line DL to the storage capacitor C and the gate electrode of the drive thin film transistor TD. The drive thin film transistor TD controls current I supplied from the power line to the OLED in response to the data signal supplied to the gate electrode of the drive thin film transistor TD, thereby adjusting the light emission amount of the OLED. Even when the switch thin film transistor TS is turned off, the drive thin film transistor TD supplies constant current I by a voltage changed in the storage capacitor C until a data signal of a next frame is supplied and, as such, the OLED continues emission of light.

As illustrated in FIG. 3, the drive thin film transistor TD includes a gate electrode 102 connected to the gate line GL while being formed on a substrate 100, a gate insulating film 112 formed on substrate 100 including the gate electrode 102, and an oxide semiconductor layer 114 formed to overlap with the gate electrode 102 under the condition that the gate insulating film 112 is interposed between the oxide semiconductor layer 114 and the gate electrode 102. The drive thin film transistor TD also includes an etch stopper 106 formed on the oxide semiconductor layer 114, to protect the oxide semiconductor layer 114 from oxygen while preventing damage to the oxide semiconductor layer 114, a source electrode 108 connected to the data line DL, and a drain electrode 110 formed to face the source electrode 108. A first protective film 118 is formed on the gate insulating film 112 including the drive thin film transistor TD.

The oxide semiconductor layer 114 is made of an oxide containing at least one metal selected from Zn, Cd, Ga, In, Sn, Hf, and Zr. When a thin film transistor includes the above-described oxide semiconductor layer 114, advantages of high charge mobility and low current leakage, as compared to a thin film transistor including a silicon semiconductor layer, are realized. The thin film transistor, which includes the silicon semiconductor layer, is formed through a high temperature process, and is subjected to a crystallization process. For this reason, when such a thin film transistor has an enlarged area, uniformity in the crystallization process is degraded. As a result, there is a disadvantage in providing an enlarged area. On the other hand, the thin film transistor, which includes the oxide semiconductor layer 114, may be formed through a low temperature process, and may be advantageous in providing an enlarged area.

An R color filter 124R is formed on the first protective film 118 in the R sub-pixel region, to enable emission of red (R). A G color filter 124G is formed on the first protective film 118 in the G sub-pixel region, to enable emission of green (G). A B color filter 124B is formed on the first protective film 118 in the B sub-pixel region, to enable emission of blue (B). No color filter is formed on the first protective film 118 in the W sub-pixel region, to enable emission of white (W). A second protective film 126 is formed on the first protective film 118 including the R, G, and B color filters 124R, 124G, and 124B.

The white OLED includes a first electrode 240 connected to the drain electrode of the drive thin film transistor TD, a second electrode 230 facing the first electrode 240, a bank insulating film 130 formed with a bank hole 132 to expose the first electrode 240, and a light emitting layer 250 interposed between the first electrode 240 and the second electrode 230.

FIG. 3 illustrates bottom emission in which light emitted from the light emitting layer 250 emerges downward. In accordance with an embodiment of the present invention, however, the OLED may emit light in the form of top emission or both-side emission. Thus, there is no limitation as to emission type.

The first electrode 240 is an anode, and is made of a transparent conductive material such as a transparent conductive oxide (TCO), for example, indium tin oxide (ITO) or indium zinc oxide (IZO).

The second electrode 230 is a cathode, and is made of a reflective metal material. The reflective metal material may include aluminum (Al), gold (Au), molybdenum (MO), chromium (Cr), copper (Cu), LiF, or an alloy of aluminum and LiF.

Hereinafter, the white OLED will be described in more detail.

First Embodiment

FIG. 4 is a perspective view illustrating a structure of the white OLED according to a first embodiment of the present invention. FIG. 5 is a band diagram of the white OLED illustrated in FIG. 4.

As illustrated in FIG. 4, the white OLED according to the first embodiment of the present invention has a structure in which a hole injection layer 214, a first hole transport layer 224a, a second hole transport layer 224b, at least two light emitting layers 226a and 226b, and an electron transport layer 228 are sequentially stacked between the first electrode 240 and the second electrode 230. The at least two light emitting layers 226a and 226b contain different hosts while containing the same dopant. The dosages of the dopants in the at least two light emitting layers 226a and 226b are different. Hereinafter, the at least two light emitting layers 226a and 226b will be described in conjunction with an example in which the at least two light emitting layers 226a and 226b are constituted by a first light emitting layer 226a and a second light emitting layer 226b.

The first light emitting layer 226a contains a first host 1Host and a phosphorescent yellow-phosphorescent green dopant. The second light emitting layer 226b contains a second host 2Host and a phosphorescent yellow-phosphorescent green dopant. The first light emitting layer 226a and second light emitting layer 22b are formed by co-depositing the same dopant in different dosages in the first and second hosts 1Host and 2Host, respectively. The first host 1Host of the first light emitting layer 226a and the second host 2Host of the second light emitting layer 226b have different highest occupied molecular orbital (HOMO) levels and different lowest unoccupied molecular orbital (LUMO) levels.

That is, as illustrated in FIG. 5, the first host 1Host has a first HOMO level and a first LUMO level. The first HOMO level is lower than or equal to the HOMO level of the second hole transport layer 224b. The difference between the first HOMO level and the HOMO level of the second hole transport layer 224b is −0.05 to −0.5 eV. Accordingly, injection of holes from the second hole transport layer 224b into the first host 1Host of the first light emitting layer 226a is smoothly carried out. For example, the first HOMO level is −6.0 to −5.0 eV, and the first LUMO level is −2.5 to −2.3 eV. The first host 1Host exhibits high hole mobility of $5.0 \times 10^{-5}$ to $1.0 \times 10^{-5}$ cm$^2$/Vs. The dosage of the dopant in the first light emitting layer 226a is 1 to 10% on the basis of the volume of the first light emitting layer 226a. The triplet level of the first host 1Host is 2.0 to 3.0 eV.

The second host 1Host has a second HOMO level and a second LUMO level. The second LUMO level is greater than or equal to the LUMO level of the electron transport layer 228. The difference between the second LUMO level and the LUMO level of the electron transport layer 228 is −0.05 to −0.5 eV. Accordingly, injection of electrons from the electron transport layer 228 into the second host 2Host of the second light emitting layer 226b is smoothly carried out. For example, the second HOMO level is −6.5 to −5.0 eV, and the second LUMO level is −3.0 to −2.0 eV. The second host 2Host exhibits high hole mobility of $9.0 \times 10^{-5}$ to $1.0 \times 10^{-3}$ cm$^2$/Vs. The dosage of the dopant in the second light emitting layer 226b is 10 to 20% on the basis of the volume of the second light emitting layer 226b. The triplet level of the second host 2Host is 2.0 to 3.0 eV.

Thus, the dosage of the dopant in the first light emitting layer 226a is lower than that of the second light emitting layer 226b. Generally, the current amount of a light emitting layer and the brightness of the light emitting layer are inversely proportional (cd/A). Due to such a relation, there may be a roll-off phenomenon in which the brightness of the light emitting layer is gradually reduced as the current amount of the light emitting layer increases. It may be possible to eliminate or reduce such a roll-off phenomenon by adjusting the dosage of the dopant in the first light emitting layer 226a and the dosage of the dopant in the second light emitting layer 226 to differ.

That is, a dosage optimized to change a zone where excitons are generated in accordance with current amount, based on physical characteristics of hosts, is applied to the light emitting layer, to eliminate a roll-off phenomenon.

Second Embodiment

On the other hand, a white OLED having a multi-stack structure including the OLED structure described with reference to FIG. 4 may be realized.

Figure 6:
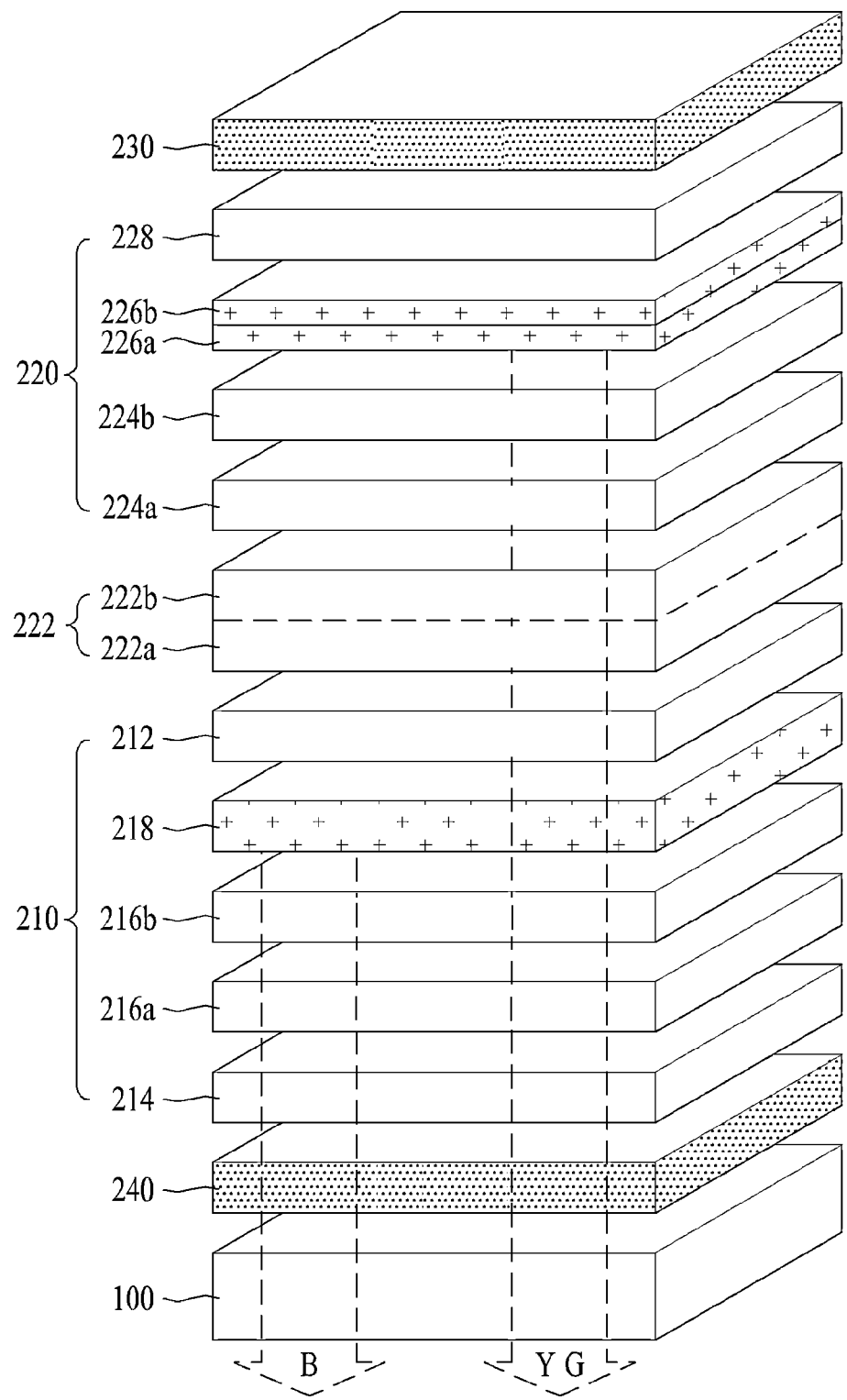
FIG. 6 is a perspective view illustrating a white OLED according to a second embodiment of the present invention.

FIG. 6 is a perspective view illustrating a white OLED according to a second embodiment of the present invention. The white OLED of FIG. 6 has a multi-stack structure including the white OLED structure of FIG. 4.

As illustrated in FIG. 6, the white OLED according to the second embodiment of the present invention has a multi-stack structure including a first stack 210, a charge generation layer 222, and a second stack 220. Such an OLED, which includes a multi-stack structure, includes light emitting layers of different colors in different stacks. In this case, white light is realized through mixture of light beams emitted from respective light emitting layers of the stacks. FIG. 6 illustrates bottom emission in which light beams emitted from light emitting layers 218, 226a, and 226b emerge downward. In accordance with an embodiment of the present invention, however, the OLED may emit light in the form of top emission or both-side emission. Thus, there is no limitation as to emission type.

The first electrode 240 is an anode, and is made of a transparent conductive material such as a transparent conductive oxide (TCO), for example, indium tin oxide (ITO) or indium zinc oxide (IZO).

The second electrode 230 is a cathode, and is made of a reflective metal material. The reflective metal material may include aluminum (Al), gold (Au), molybdenum (MO), chromium (Cr), copper (Cu), LiF, or an alloy of aluminum and LiF.

The first stack 210 has a structure in which a hole injection layer (HIL) 214, a third hole transport layer (HTL) 216a, a fourth hole transport layer 216b, a third light emitting layer (ETL) 218, and a second electron transport layer (ETL) 212 are sequentially stacked between the first electrode 240 and the charge generation layer 222. In this case, the third light emitting layer 218 contains a host and a blue fluorescent material as a dopant, to emit blue light.

The charge generation layer 222 is formed between the stacks 210 and 220, to adjust charge balance between the stacks 210 and 220. The charge generation layer 222 includes an N-type organic layer 222a arranged adjacent to the first stack 210, to inject electrons into the first stack 210, and a P-type organic layer 222b arranged adjacent to the second stack 220, to inject holes into the second stack 220.

The second stack 220 has the structure described with reference to FIG. 4. That is, the second stack 220 has a structure in which the first hole transport layer 224a, second hole transport layer 224b, at least two light emitting layers 226a and 226b, and first electron transport layer 228 are sequentially stacked between the charge generation layer 222 and the second electrode 230. The at least two light emitting layers 226a and 226b contain different hosts while containing the same dopant. The dosages of the dopants in the at least two light emitting layers 226a and 226b are different. Hereinafter, the at least two light emitting layers 226a and 226b will be described in conjunction with an example in which the at least two light emitting layers 226a and 226b are constituted by the first light emitting layer 226a and the second light emitting layer 226b. The configurations of the first and second light emitting layers 226a and 226b are identical to those of FIGS. 4 and 5 and, as such, no description thereof will be given.

In the white OLED according to the second embodiment of the present invention, which has the above-described configuration, the first light emitting layer 226a and second light emitting layer 226b may adjust intensity of light in accordance with positions thereof. This will be described with reference to FIGS. 7A and 7B.

Figure 7A:
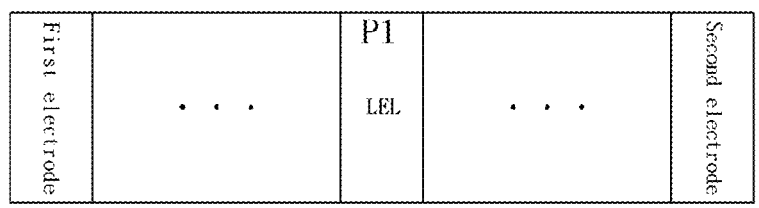
FIG. 7A is a sectional view illustrating white OLEDs having different positions of light emitting layers.
Figure 7A:
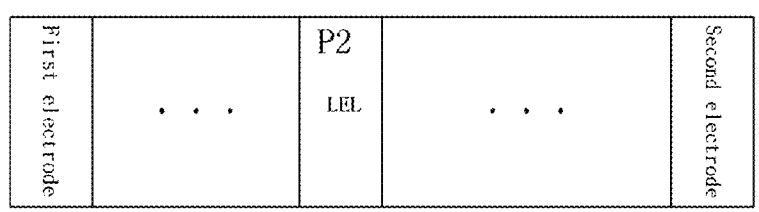
Figure 7A:
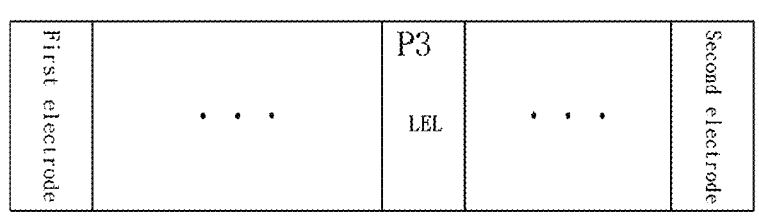
Figure 7B:
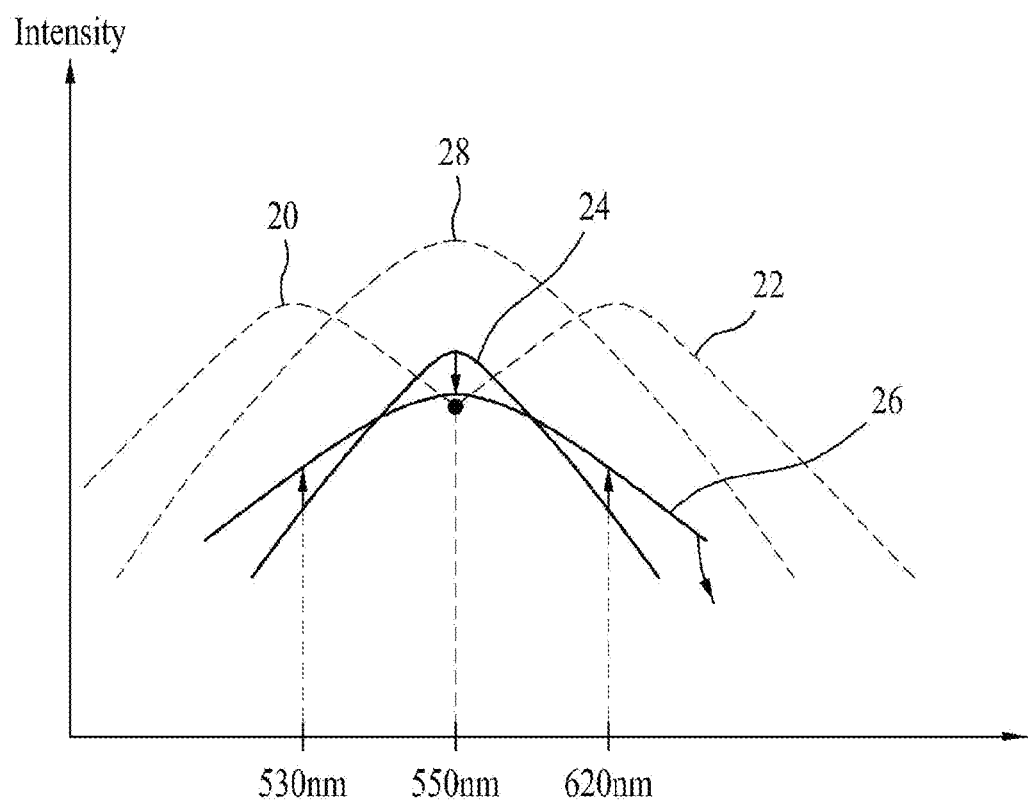
FIG. 7B is a graph explaining electroluminescence peak (EL peak) wavelengths according to positions illustrated in FIG. 7A.

FIG. 7A is a sectional view illustrating white OLEDs having different positions of light emitting layers. FIG. 7B is a graph explaining electroluminescence peak (EL peak) wavelengths according to positions illustrated in FIG. 7A.

The white OLED according to case A has a multi-stack structure including a first stack having a florescent blue light emission layer, and a second stack having a phosphorescent yellow-phosphorescent green light emitting layer. The phosphorescent yellow-phosphorescent green light emitting layer of the second stack is formed at a first position P1.

The white OLED according to case B has a multi-stack structure including a first stack having a florescent blue light emission layer, and a second stack having a phosphorescent yellow-phosphorescent green light emitting layer. The phosphorescent yellow-phosphorescent green light emitting layer of the second stack is formed at a second position P2 shifted to the left from the first position P1. This position corresponds to the position of the first light emitting layer 226a of the second stack 220.

The white OLED according to case C has a multi-stack structure including a first stack having a florescent blue light emission layer, and a second stack having a phosphorescent yellow-phosphorescent green light emitting layer. The phosphorescent yellow-phosphorescent green light emitting layer of the second stack is formed at a third position P3 shifted to the right from the first position P1. This position corresponds to the position of the second light emitting layer 226b of the second stack 220.

As described above, the white OLEDs according to cases A, B, and C differ in terms of the position of the phosphorescent yellow-phosphorescent green light emitting layer in the second stack. In a white OLED, the electroluminescence peak position of a light emitting layer may be varied in accordance with variation of the position of the light emitting layer. This will be described with reference to a graph of FIG. 7B.

FIG. 7B depicts graphs of electroluminescence peak (EL peak) wavelengths according to phosphorescent yellow-phosphorescent green light emitting layer in the second stack without depicting graphs of EL peak wavelengths according to the fluorescent blue light emitting layer in the first stack.

A first one of the depicted graphs, namely, a first graph 28, is a graph of the EL peak wavelength in case A of FIG. 7A wherein the light emitting layer of the second stack is arranged at the first position P1. A second one of the depicted graphs, namely, a second graph 20, is a graph of the EL peak wavelength in case B of FIG. 7A wherein the light emitting layer of the second stack is arranged at the second position P2. A third one of the depicted graphs, namely, a third graph 22, is a graph of the EL peak wavelength in case C of FIG. 7A wherein the light emitting layer of the second stack is arranged at the second position P3.

The EL peak of the second graph 20 is disposed at a position shifted to the left from the EL peak of the first graph 28. The EL peak of the third graph 22 is disposed at a position shifted to the right from the EL peak of the first graph 28. Thus, the position of the EL peak of a light emitting layer may depend on the position of the light emitting layer.

In detail, the electroluminescence peak (EL peak) wavelength of a white OLED is determined by the product of a photoluminescence peak (PL peak) wavelength, at which intrinsic color of the material of a light emitting layer is emitted, by an emittance peak (EM peak) of an organic stack structure of the white OLED.

A fourth one of the depicted graphs, namely, a fourth graph 24, is a graph of the EL peak wavelength in case A. The fourth graph 24 depicts the product of the EL peak wavelength of the first case A depicted by the first graph 28 by a PL peak wavelength, at which intrinsic color of a phosphorescent yellow-phosphorescent green light emitting layer is emitted.

A fifth one of the depicted graphs, namely, a fifth graph 26, is a graph depicting the product of the EL peak wavelength of the white OLED according to the second case B by the PL peak wavelength of the white OLED according to case C. That is, the fifth graph 26 is a graph depicting the product of the EL peak wavelengths in cases B and C depicted by the second and third graphs 20 and 30 by the PL peak wavelength, at which intrinsic color of the phosphorescent yellow-phosphorescent green light emitting layer is emitted.

When the fourth graph 24 and fifth graph 26 are compared with each other, it can be seen that the fourth graph 24 exhibits higher intensity of light at a wavelength of 550 nm than that of the fifth graph 26 while exhibiting lower intensity of light at a wavelength range of 530 nm to 620 nm than those of the fifth graph 26, as illustrated in FIG. 7B. In other words, it can be seen that the fifth graph 26 exhibits lower intensity of light at a wavelength of 550 nm than that of the fourth graph 24 while exhibiting higher intensity of light at a wavelength range of 530 nm to 620 nm than those of the fourth graph 24, as illustrated in FIG. 7B.

Figure 8:
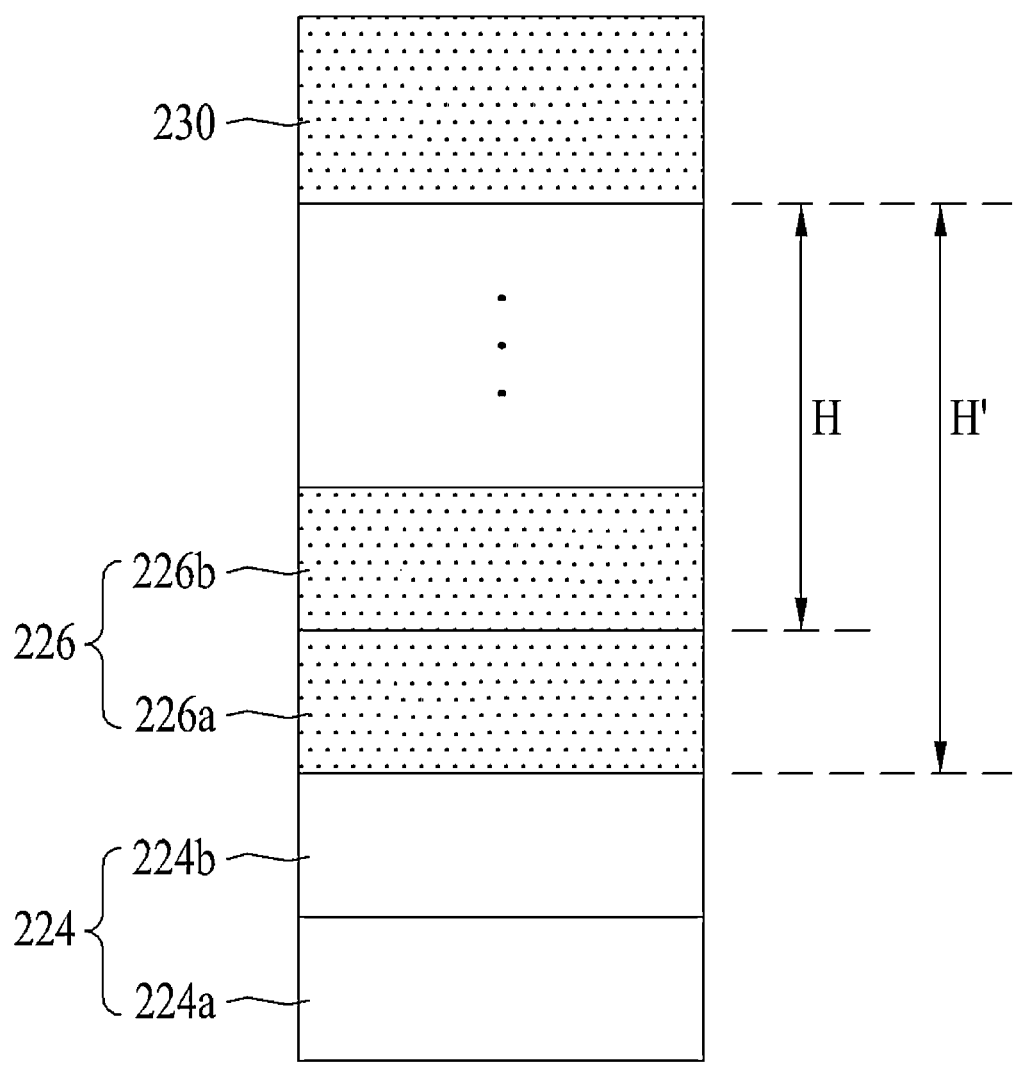
FIG. 8 is a sectional view explaining positions of first and second light emitting layers according to the first and second embodiments of the present invention.

That is, since the wavelength of 530 nm is a green light wavelength, and the wavelength of 620 nm is a red light wavelength, the intrinsic color of blue light can be emitted when the intensity of light at a wavelength of 530 nm is high and, as such, enhanced color reproduction range is obtained, and the intrinsic color of red light can be emitted when the intensity of light at a wavelength of 620 nm is high and, as such, enhanced color reproduction range is obtained, FIG. 8 is a sectional view explaining positions of the first and second light emitting layers according to the first and second embodiments of the present invention.

As illustrated in FIG. 8, the position of the first light emitting layer in the second stack is expressed by the following Expression 1, and the position of the second light emitting layer in the second stack is expressed by the following Expression 2.

$$H' = \lambda/4n + 200 \text{ Å} \sim \lambda/4n - 100 \text{ Å} \quad \text{[Expression 1]}$$

$$H = \lambda/4n + 50 \text{ Å} \sim \lambda/4n - 200 \text{ Å} \quad \text{[Expression 2]}$$

In Expressions 1 and 2, "H'" represents a thickness from the first light emitting layer to a position reaching the second electrode, and "H" means a thickness from the second light emitting layer to a position reaching the second electrode. In addition, "n" represents refractive index, and "λ" represents a PL peak wavelength of a dopant.

Figure 9:
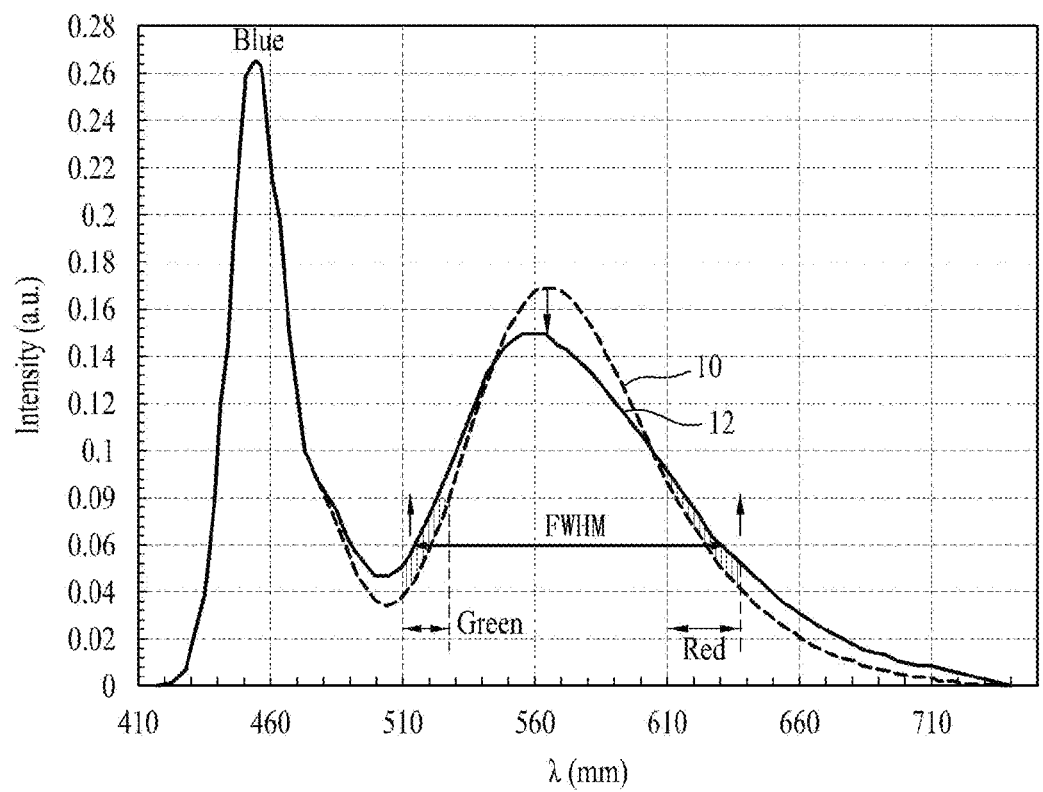
FIG. 9 depicts an EL peak wavelength of the white OLED according to the first or second embodiment of the present invention, and an EL peak wavelength of a white OLED according to a comparative example.

FIG. 9 depicts an EL peak wavelength of the white OLED according to the first or second embodiment of the present invention, and an EL peak wavelength of a white OLED according to a comparative example.

In FIG. 9, a first graph 10 depicts an EL peak wavelength of the white OLED according to the comparative example, which includes a first stack having a fluorescent blue light emitting layer, and a second stack having a phosphorescent yellow-phosphorescent green light emitting layer.

The second graph 20 depicts an EL peak wavelength of the white OLED according to the first or second embodiment of the present invention, which includes a first stack having a fluorescent blue light emitting layer, a first light emitting layer having a phosphorescent yellow-phosphorescent green light emitting layer and a first host, and a second light emitting layer having a phosphorescent yellow-phosphorescent green light emitting layer and a second host.

As illustrated in FIG. 9, the first graph 10 exhibits high intensity of light at a wavelength of 550 nm while exhibiting low intensity of light at a wavelength range of 525 to 530 nm and at a wavelength range of 610 to 625 nm.

On the other hand, the second graph 12 exhibits low intensity of light at a wavelength of 550 nm while exhibiting high intensity of light at a wavelength range of 525 to 530 nm and at a wavelength range of 610 to 625 nm.

As described above, the wavelength range of 525 to 530 nm is a green light wavelength range, whereas the wavelength range of 610 to 625 nm is a red light wavelength range.

Emission efficiency is proportional to the FWHM area. Referring to FIG. 9, the FWHM area in the second graph 12 is wider than that of the first graph 10. When the FWHM area increases, increased intensity of light is exhibited. That is, the FWHM area is proportional to intensity of light.

Accordingly, when the FWHM area increases, the area of the wavelength range of 525 to 530 nm and the area of the wavelength range of 610 to 625 nm are increased and, as such, the intensity of light in the wavelength range is increased.

Thus, as the FWHM area increases, the intensity of light in the wavelength range of 525 to 530 nm is increased because the area of the wavelength range of 525 to 530 nm is increased and, as such, an enhancement in color reproduction range is achieved in that intrinsic color of green light can be exhibited. When the FWHM area increases, the intensity of light in the wavelength range of 610 to 625 nm is also increased because the area of the wavelength range of 610 to 625 nm is increased and, as such, an enhancement in color reproduction range is achieved in that intrinsic color of red light can be exhibited.

As described above, the second graph exhibits excellent color reproduction range in that it exhibits high intensity in a green light wavelength range, and high intensity in a red light wavelength range. In accordance with the enhanced color reproduction range, an enhancement in panel efficiency is achieved. That is, the display device, which employs the white OLED according to the present invention, exhibits a panel efficiency of 28.40, whereas the display device, which employs the white OLED according to the comparative example, exhibits a panel efficiency of 28.21. Thus, the panel efficiency of the display device, which employs the white OLED according to the present invention, is enhanced about 10% over that of the display device, which employs the white OLED according to the comparative example.

As apparent from the above description, it may be possible to enhance color reproduction range and panel efficiency, using the white OLED according to the present invention.

Third Embodiment

In accordance with the first embodiment of the present invention, it may be possible to reduce a roll-off phenomenon in which the brightness of a light emitting layer is reduced when as the current amount of the light emitting layer increases by adjusting the dosage of the dopant in the first light emitting layer 226a and the dosage of the dopant in the second light emitting layer 226 to differ.

However, the present invention is not limited to such a configuration. For example, it may be possible to reduce a roll-off phenomenon in which the brightness of a light emitting layer is reduced when as the current amount of the light emitting layer increases by forming the first light emitting layer 226a through mixture of the first and second hosts, forming the second light emitting layer 226b through mixture of the first host with a third host while equalizing the dosage of the dopant in the first light emitting layer 226a and the dosage of the dopant in the second light emitting layer 226.

Figure 10:
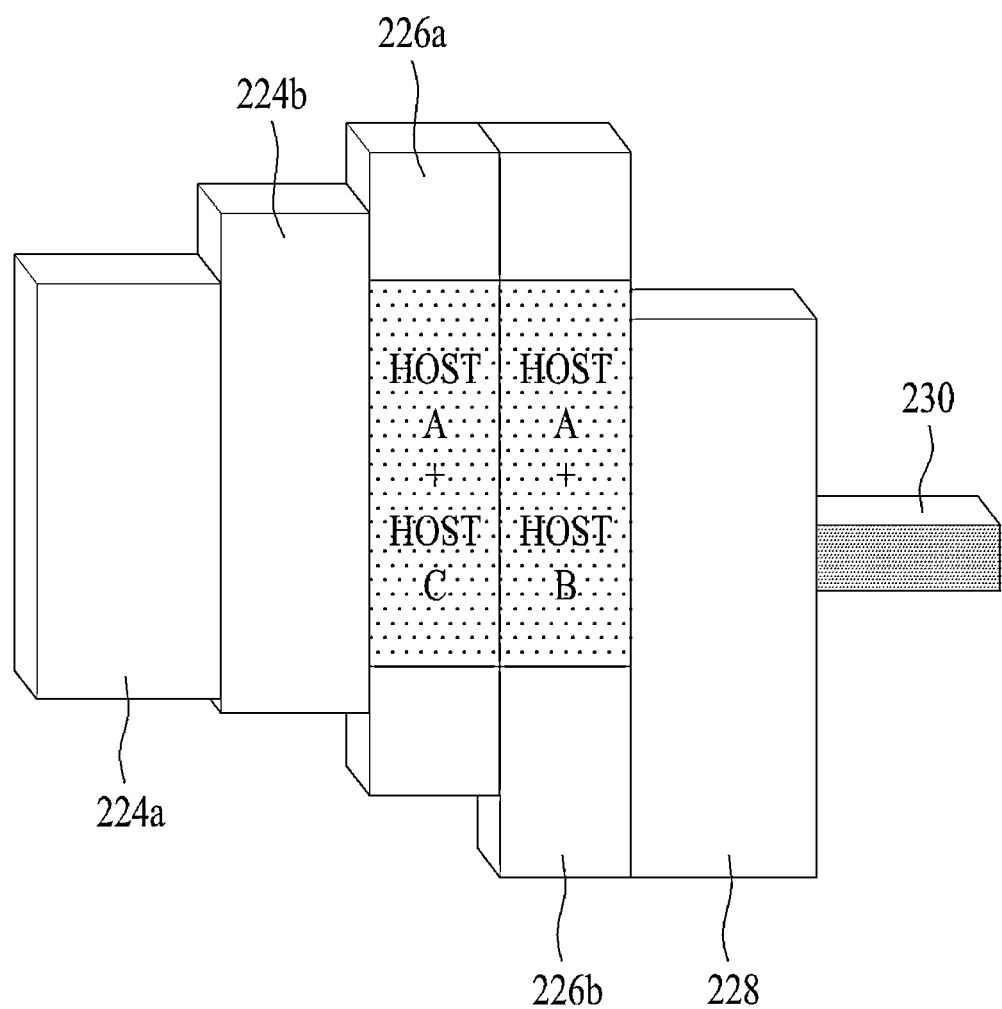
FIG. 10 is a band diagram of a white OLED according to a third embodiment of the present invention.

FIG. 10 is a band diagram of a white OLED according to a third embodiment of the present invention.

Similarly to the structure described with reference to FIG. 4, the white OLED according to the third embodiment of the present invention has a structure in which a hole injection layer 214, a first hole transport layer 224a, a second hole transport layer 224b, at least two light emitting layers 226a and 226b, and an electron transport layer 228 are sequentially stacked between the first electrode 240 and the second electrode 230. However, the white OLED according to the third embodiment of the present invention is different from that of the first embodiment of the present invention in terms of the hosts and dosages of the at least two light emitting layers 226a and 226b.

That is, the at least two light emitting layers 226a and 226b of the white OLED according to the third embodiment of the present invention have the same host and different hosts while having the same dopant, and the dopants of the at least two light emitting layers 226a and 226b have the same dosage. Hereinafter, the at least two light emitting layers 226a and 226b will be described in conjunction with an example in which the at least two light emitting layers 226a and 226b are constituted by a first light emitting layer 226a and a second light emitting layer 226b.

As illustrated in FIG. 10, the first light emitting layer 226a contains a first host Host A, a second host Host C, and a phosphorescent yellow-phosphorescent green dopant. The second light emitting layer 226b contains a first host Host A, a third host Host B, and a phosphorescent yellow-phosphorescent green dopant. The first light emitting layer 226a and second light emitting layer 22b are formed by co-depositing the same dopant in the same dosage. The first host Host A, second host Host C, and third host Host B of the first light emitting layer 226a and second light emitting layer 226b have different HOMO levels and different LUMO levels.

That is, as illustrated in FIG. 10, the LUMO level of the first host Host A is greater than or equal to the LUMO level of the electron transport layer 228. The HOMO level of the first host Host A is −6.0 to −5.0 eV. The first host Host A has high hole mobility of $5.0 \times 10^{-5}$ to $1.0 \times 10^{-5}$ cm$^2$/Vs. The difference between the LUMO level of the first host Host A and the LUMO level of the electron transport layer 228 is +0.05 to +0.2 eV.

The HOMO level of the second host Host C is lower than or equal to the HOMO level of the second hole transport layer 224b. The LUMO level of the second host Host C is −2.5 to −2.3 eV. The second host Host C has high hole mobility of $9.0 \times 10^{-4}$ to $1.0 \times 10^{-3}$ cm$^2$/Vs. The difference between the HOMO level of the second host Host C and the HOMO level of the second hole transport layer 224b is −0.05 to −0.5 eV.

The HOMO level of the third host Host B is lower than or equal to the HOMO level of the second hole transport layer 224b. The LUMO level of the third host Host B is −2.5 to −2.3 eV. The third host Host B has high hole mobility of $9.0 \times 10^{-4}$ to $1.0 \times 10^{-3}$ cm$^2$/Vs. The difference between the HOMO level of the third host Host B and the HOMO level of the second hole transport layer 224b is −0.05 to −0.5 eV.

In this case, the hole mobility of the third host Host B should be higher than that of the second host Host C. The triplet levels of the first host Host A, second host Host C, and third host Host B are 2.0 to 3.0 eV.

The dosage of each dopant in the first and second light emitting layers 226a and 226b is 8 to 25% on the basis of the volume of the corresponding one of the first and second light emitting layers 226a and 22b.

Fourth Embodiment

Meanwhile, a white OLED having a multi-stack structure including the OLED structure having features described with reference to FIG. 10 may be realized.

Figure 11:
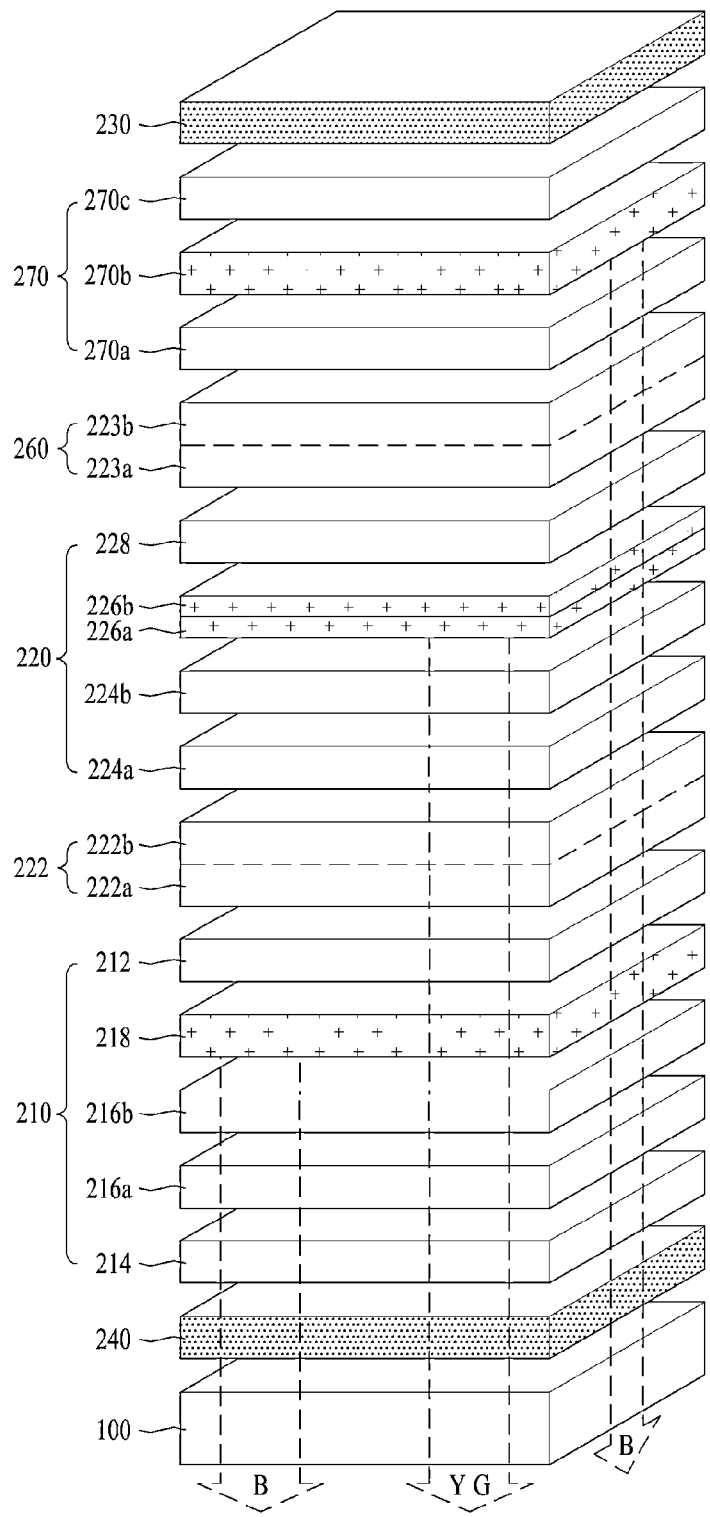
FIG. 11 is a perspective view illustrating a white OLED according to a fourth embodiment of the present invention.

FIG. 11 is a perspective view illustrating a white OLED according to a fourth embodiment of the present invention. The white OLED of FIG. 11 has a multi-stack structure including a white OLED structure having features described with reference to FIGS. 4 and 10.

As illustrated in FIG. 11, the white OLED according to the fourth embodiment of the present invention has a multi-stack structure including a first stack 210, a first charge generation layer 222, a second stack 220, a second charge generation layer 260, and a third stack 270. Such an OLED, which includes a multi-stack structure, includes light emitting layers of different colors in different stacks. In this case, white light is realized through mixture of light beams emitted from respective light emitting layers of the stacks. FIG. 11 illustrates bottom emission in which light beams emitted from first, second, third, and fourth light emitting layers 218, 226a, 226b, and 270b emerge downward. In accordance with an embodiment of the present invention, however, the OLED may emit light in the form of top emission or both-side emission. Thus, there is no limitation as to emission type.

The first electrode 240 is an anode, and is made of a transparent conductive material such as a transparent conductive oxide (TCO), for example, indium tin oxide (ITO) or indium zinc oxide (IZO).

The second electrode 230 is a cathode, and is made of a reflective metal material. The reflective metal material may include aluminum (Al), gold (Au), molybdenum (MO), chromium (Cr), copper (Cu), LiF, or an alloy of aluminum and LiF.

The first stack 210 has a structure in which a hole injection layer (HIL) 214, a third hole transport layer (HTL) 216a, a fourth hole transport layer 216b, a third light emitting layer (ETL) 218, and a second electron transport layer (ETL) 212 are sequentially stacked between the first electrode 240 and the first charge generation layer 222. In this case, the third light emitting layer 218 contains a host and a blue fluorescent material as a dopant, to emit blue light.

The first and second charge generation layers 222 and 260 are formed between the stacks 210 and 220, to adjust charge balance between the stacks 210 and 220. The first charge generation layer 222 includes an N-type organic layer 222a arranged adjacent to the first stack 210, to inject electrons into the first stack 210, and a P-type organic layer 222b arranged adjacent to the second stack 220, to inject holes into the second stack 220.

The second stack 220 has the structure described with reference to FIG. 4. That is, the second stack 220 has a structure in which the first hole transport layer 224a, second hole transport layer 224b, at least two light emitting layers 226a and 226b, and first electron transport layer 228 are sequentially stacked between the charge generation layer 222 and the second charge generation layer 260. The at least two light emitting layers 226a and 226b contain the same host and different hosts while containing the same dopant, as described with reference to FIG. 10. Since the configurations of the first light emitting layer 226a and the second light emitting layer 226b are identical to those of FIGS. 4 and 10 and, as such, no description thereof will be given.

The second charge generation layer 260 includes an N-type organic layer 260a arranged adjacent to the second stack 220, to inject electrons into the second stack 220, and a P-type organic layer 260b arranged adjacent to the third stack 270, to inject holes into the third stack 270.

The third stack 270 has a structure in which a fifth hole transport layer 270a, a fourth light emitting layer 270b, and a third electron transport layer 270c are sequentially stacked between the second charge generation layer 260 and the second electrode. In this case, the fourth light emitting layer 270b contains a host and a blue fluorescent material as a dopant, to emit blue light.

The white OLED according to the fourth embodiment of the present invention, which has the above-described configuration, have features similar to the features described with reference to FIGS. 7A and 7B, FIG. 8, and FIG. 9.

As apparent from the above description, the organic light emitting display device according to the present invention may include a white light emitting device including at least two phosphorescent light emitting layers. The at least two light emitting layers may contain different hosts while containing the same dopant. The dosages of the dopants in the at least two light emitting layers may be different. Accordingly, it may be possible to reduce or eliminate a roll-off phenomenon in which the brightness of a light emitting layer is reduced when as the current amount of the light emitting layer increases by adjusting the dosages of the dopants in the at least two light emitting layers to differ.

In addition, the organic light emitting display device according to the present invention may achieve an increase in the FWHM area because it includes at least two light emitting layers having different hosts. When the FWHM area increases, the intensity of light at green wavelengths and the intensity of light at red wavelengths are increased and, as such, an enhancement in color reproduction range may be achieved. In accordance with such an enhanced color reproduction range, an enhancement in panel efficiency may also be achieved.

One of the at least two light emitting layers, which is arranged adjacent to a hole transport layer, exhibits a HOMO level lower than or equal to the HOMO level of the hole transport layer. Accordingly, it may be possible to achieve smooth injection of holes.

Another one of the at least two light emitting layers, which is arranged adjacent to an electron transport layer, exhibits a LUMO level greater than or equal to the LUMO level of the electron transport layer. Accordingly, it may be possible to achieve smooth injection of holes.

Meanwhile, the organic light emitting display device according to the present invention may include a white light emitting device including at least two phosphorescent light emitting layers, which contain mixtures of different hosts and the same host, respectively, while containing the same dopant. The dosages of the dopants in the at least two light emitting layers may be equal. Accordingly, it may be possible to reduce or eliminate a roll-off phenomenon in which the brightness of a light emitting layer is reduced when as the current amount of the light emitting layer increases by equalizing the dosages of the dopants in the at least two light emitting layers.

In addition, the organic light emitting display device according to the present invention may achieve an increase in the FWHM area because it includes at least two light emitting layers having mixtures of different hosts and the same host, respectively. When the FWHM area increases, the intensity of light at green wavelengths and the intensity of light at red wavelengths are increased and, as such, an enhancement in color reproduction range may be achieved. In accordance with such an enhanced color reproduction range, an enhancement in panel efficiency may also be achieved.

Since smooth injection of holes and electrons is achieved, it may be possible to increase the lifespan of the device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device, comprising:
first and second electrodes on a substrate and facing each other; and
a hole injection layer, a first hole transport layer, a second hole transport layer in direct contact with the first hole transport layer, at least two light emitting layers, and an electron transport layer sequentially stacked between the first and second electrodes,
wherein the at least two light emitting layers comprise different respective hosts doped with the same dopant in different respective dosages,
wherein the at least two light emitting layers comprises:
a first light emitting layer comprising a first host doped with a phosphorescent yellow-phosphorescent green dopant, and
a second light emitting layer comprising a second host different from the first host doped with the same phosphorescent yellow-phosphorescent green dopant as the first light emitting layer in a different dosage than the first light emitting layer,
wherein the phosphorescent yellow-phosphorescent green dopant of the first light emitting layer is doped in the first light emitting layer in a dosage of 1% to 10% on the basis of a volume of the first light emitting layer, and
wherein the phosphorescent yellow-phosphorescent green dopant of the second light emitting layer is doped in the second light emitting layer in a dosage of 10% to 20% on the basis of a volume of the second light emitting layer.

2. The organic light emitting display device according to claim 1, wherein:
the first host has a first highest occupied molecular orbital (HOMO) level lower than or equal to a HOMO level of the second hole transport layer; and
the first HOMO level has a difference of −0.05 to −0.5 eV from the HOMO level of the second hole transport layer.

3. The organic light emitting display device according to claim 1, wherein:
the first host has a first highest occupied molecular orbital (HOMO) level of −6.0 to −5.0 eV; and
the first host has a first lowest unoccupied molecular orbital (LUMO) level of −2.5 to −2.3 eV and a hole mobility of $5.0 \times 10^{-5}$ to $1.0 \times 10^{-5}$ cm$^2$/Vs.

4. The organic light emitting display device according to claim 1, wherein:
the second light emitting layer has a second lowest unoccupied molecular orbital (LUMO) level greater than or equal to a LUMO level of the electron transport layer; and
the second LUMO level has a difference of −0.05 to −0.5 eV from the LUMO level of the electron transport layer.

5. The organic light emitting display device according to claim 1, wherein:
the second light emitting layer has a second highest occupied molecular orbital (HOMO) level of −6.5 to −5.0 eV;
a second lowest unoccupied molecular orbital (LUMO) level of −3.0 to −2.0 eV;
the second host has an electron mobility of $9.0 \times 10^{-5}$ to $1.0 \times 10^{-3}$ cm$^2$/Vs.

6. The organic light emitting display device according to claim 1, wherein each of the first and second hosts has a triplet level of 2.0 to 3.0 eV.

7. The organic light emitting display device according to claim 1, wherein a thickness from the first light emitting layer to a position reaching the second electrode is expressed by the following Expression 1:

$$H' = \lambda/4n + 200 \text{ Å} \sim \lambda/4n - 100 \text{ Å} \quad \text{[Expression 1]}$$

wherein:
"H'" represents a thickness from the first light emitting layer to the position reaching the second electrode,
"n" represents a refractive index, and
"λ" represents a photoluminescence peak wavelength of the dopant.

8. The organic light emitting display device according to claim 1, wherein a thickness from the second light emitting layer to a position reaching the second electrode is expressed by the following Expression 2:

$$H = \lambda/4n + 50 \text{ Å} \sim \lambda/4n - 200 \text{ Å} \quad \text{[Expression 2]}$$

wherein:
"H" represents a thickness from the second light emitting layer to the position reaching the second electrode,
"n" represents a refractive index, and
"λ" represents a photoluminescence peak wavelength of the dopant.

9. An organic light emitting display device, comprising:
first and second electrodes on a substrate and facing each other;
a first stack comprising a hole injection layer, a third hole transport layer, a fourth hole transport layer in direct contact with the third hole transport layer, a third light emitting layer, and a second electron transport layer sequentially stacked on the first electrode;
a second stack comprising a first hole transport layer, a second hole transport layer in direct contact with the first hole transport layer, at least two light emitting layers, and a first electron transport layer sequentially stacked between the first stack and the second electrode; and
a charge generation layer between the first stack and the second stack, to adjust charge balance between the first stack and the second stack,
wherein the at least two light emitting layers comprise different respective hosts doped with the same yellow-green dopant in different respective dosages,
wherein the charge generation layer is in direct contact with the first hole transport layer of the second stack,
wherein the at least two light emitting layers comprises:
a first light emitting layer comprising a first host doped with a phosphorescent yellow-phosphorescent green dopant, and
a second light emitting layer comprising a second host different from the first host doped with the same phosphorescent yellow-phosphorescent green dopant as the first light emitting layer in a different dosage than the first light emitting layer,
wherein the phosphorescent yellow-phosphorescent green dopant of the first light emitting layer is doped in the first light emitting layer in a dosage of 1% to 10% on the basis of a volume of the first light emitting layer, and
wherein the phosphorescent yellow-phosphorescent green dopant of the second light emitting layer is doped in the second light emitting layer in a dosage of 10% to 20% on the basis of a volume of the second light emitting layer.

10. An organic light emitting display device, comprising:
first and second electrodes on a substrate and facing each other; and
a hole injection layer, a first hole transport layer, a second hole transport layer in direct contact with the first hole transport layer, at least first and second light emitting layers, and an electron transport layer sequentially stacked between the first and second electrodes,
wherein the first light emitting layer comprises a first host and a second host,
wherein the second light emitting layer comprises the first host and a third host, and
wherein the first and second light emitting layers are doped with the same phosphorescent yellow-phosphorescent green dopant in the same dosage.

11. The organic light emitting display device according to claim 10, wherein:
the first host has a first lowest unoccupied molecular orbital (LUMO) level greater than or equal to a LUMO level of the electron transport layer; and
the first LUMO level has a difference of +0.05 to +0.2 eV from the LUMO level of the electron transport layer.

12. The organic light emitting display device according to claim 10, wherein the first host has a first highest occupied molecular orbital (HOMO) level of −6.0 to −5.0 eV and a hole mobility of $5.0 \times 10^{-5}$ to $1.0 \times 10^{-5}$ cm$^2$/Vs.

13. The organic light emitting display device according to claim 10, wherein:
the second host has a second highest occupied molecular orbital (HOMO) level lower than or equal to a HOMO level of the second hole transport layer; and
the second HOMO level has a difference of −0.05 to −0.5 eV from the HOMO level of the second hole transport layer.

14. The organic light emitting display device according to claim 13, wherein the second host has a second lowest unoccupied molecular orbital (LUMO) level of −2.5 to −2.3 eV and a hole mobility of $9.0 \times 10^{-4}$ to $1.0 \times 10^{-3}$ cm$^2$/Vs.

15. The organic light emitting display device according to claim 10, wherein:
the third host has a third highest occupied molecular orbital (HOMO) level lower than or equal to a HOMO level of the second hole transport layer; and
the third HOMO level has a difference of −0.05 to −0.5 eV from the HOMO level of the second hole transport layer.

16. The organic light emitting display device according to claim 15, wherein the third host has a third lowest unoccupied molecular orbital (LUMO) level of −2.5 to −2.3 eV and a hole mobility of $9.0\times10^{-4}$ to $1.0\times10^{-3}$ cm$^2$/Vs.

17. The organic light emitting display device according to claim 10, wherein:
the third host has a higher hole mobility than the second host; and
each of the first, second, and third second hosts has a triplet level of 2.0 to 3.0 eV.

18. The organic light emitting display device according to claim 10, wherein the phosphorescent yellow-phosphorescent green dopant of each of the first and second light emitting layers is doped in the corresponding first or second light emitting layer in a dosage of 8% to 25% on the basis of a volume of the corresponding first or second light emitting layer.

19. An organic light emitting display device, comprising:
first and second electrodes on a substrate and facing each other;
a first stack comprising a hole injection layer, a third hole transport layer, a fourth hole transport layer in direct contact with the third hole transport layer, a third light emitting layer, and a second electron transport layer sequentially stacked on the first electrode;
a second stack comprising a first hole transport layer, a second hole transport layer in direct contact with the first hole transport layer, at least two first and second light emitting layers, and a first electron transport layer sequentially stacked between the first stack and the second electrode;
a first charge generation layer between the first stack and the second stack, to adjust charge balance between the first stack and the second stack;
a third stack comprising a fifth hole transport layer, a fourth light emitting layer, and a third electron transport layer stacked between the second stack and the second electrode; and
a second charge generation layer between the second stack and the third stack, to adjust charge balance between the second stack and the third stack,
wherein the first light emitting layer comprises a first host and a second host,
wherein the second light emitting layer comprises the first host and a third host different from the second host,
wherein the first and second light emitting layers are doped with the same phosphorescent yellow-phosphorescent green dopant in the same dosage, and
wherein the charge generation layer is in direct contact with the first hole transport layer of the second stack.

20. The organic light emitting display device according to claim 19, wherein each of the third and fourth light emitting layers comprises a host and a blue fluorescent material as a dopant, to emit blue light.

* * * * *